United States Patent [19]

Saxena et al.

[11] 4,056,642

[45] Nov. 1, 1977

[54] METHOD OF FABRICATING METAL-SEMICONDUCTOR INTERFACES

[75] Inventors: Arjun N. Saxena, Palo Alto; Courtney Hart, San Jose, both of Calif.

[73] Assignee: Data General Corporation, Westboro, Mass.

[21] Appl. No.: 684,207

[22] Filed: May 14, 1976

[51] Int. Cl.² .......................................... H01L 21/302
[52] U.S. Cl. ................................ 427/84; 204/192 S; 156/643; 357/15; 357/67; 427/37; 427/39; 427/88; 427/124; 427/125; 427/383 R; 427/383 D
[58] Field of Search ....................... 427/84, 88, 37, 39, 427/383 R, 383 D, 123, 124, 125; 204/192 S; 357/15, 67; 156/643

[56] References Cited

U.S. PATENT DOCUMENTS

| 3,795,557 | 3/1974 | Jacob | 156/17 |
| 3,879,597 | 4/1975 | Bensin | 204/129.3 |
| 3,956,527 | 5/1976 | Magoo | 427/94 |
| 3,983,264 | 9/1976 | Schroen | 427/39 |

Primary Examiner—Ralph S. Kendall
Assistant Examiner—John D. Smith
Attorney, Agent, or Firm—Joel Wall; Jacob Frank

[57] ABSTRACT

An improved method of fabricating metal-semiconductor interfaces such as Schottky barriers and ohmic contacts. There is disclosed apparatus and method (or process) for chemically converting, etching, or passivating the surface of a material, such as the surface of a silicon wafer, in a gaseous plasma environment consisting of atomic, neutral nitrogen which causes the surface of the material to be resistant to otherwise subsequent nascent surface oxide buildup. This process is particularly useful in manufacture of Schottky diodes, transistors, and other electronic components or discrete and integrated devices requiring high quality metal-semiconductor junctions or interfaces.

4 Claims, 6 Drawing Figures

METHOD OF FABRICATING METAL-SEMICONDUCTOR INTERFACES

BACKGROUND OF THE INVENTION

1. Field of the Invention

The present invention relates generally to a plasma process for treating material, and more particularly to a process for fabricating Schottky barriers and ohmic contacts in devices normally employed within the semiconductor electronics industry.

2. Description of Prior Art

Examples of patents which relate to formation of Schottky barriers by use of a plasma are U.S. Pat. No. 3,795,557, issued Mar. 5, 1974 to A. Jacob, and U.S. Pat. No. 3,879,597 issued Apr. 22, 1975 to Bersin et al; the disclosures of these two patents are incorporated herein by reference.

Metal-semiconductor rectifying devices have been investigated since the late 1800's. Sometime thereafter, around the turn of the century, a point-contact rectifier (metal-semiconductor junction device) may have found practical utility as evidenced by U.S. Pat. No. 775,840 issued in 1904 to J. C. Bose. In the late 1930's W. Schottky continued to study the metal-semiconductor potential barrier, and the suggestion that this potential barrier could arise from arrangement of space charges within the semiconductor, not necessarily requiring presence of an adjacent chemical layer, is attributed to him. This development continued through more recent history, and the metal-semiconductor junction rectifier presently employed in electronic circuit applications is commonly called a Schottky diode or Schottky transistor.

The Schottky barrier contact or interface, as noted, is a rectifying metal-semiconductor junction. Such Schottky barrier contacts utilize the Schottky effect based upon rectification characteristics exhibited by well known metal-semiconductor interfaces. Generally, the electrical characteristics of these contacts depend upon what is termed the "work function" of the metal, as well as the electron affinity in the semiconductor material. The work function is generally defined as the minimum energy necessary for an electron to have in order to escape into vacuum from initial energy at the Fermi level, in a metal-vacuum system. In other words, in a metal, the Fermi level is an energy reference level from which an electron is removed to the free state (vacuum electron) by an amount of energy equal to the work function.

High frequency response of these Schottky contacts or diodes is good, the positive results flowing from conduction phenomena which occurs under forward bias, caused primarily by majority carriers falling from the semiconductor into the metal. Accordingly, the otherwise frequency-limiting effect of minority carrier storage tends to be minimized. High frequency response of Schottky barrier diodes makes them quite useful in various high frequency applications, such as high speed logic and memory circuits, microwave applications, etc. The foregoing is presented as background in the history and application of the resulting semiconductor device, the device itself being prepared by the chemical/physical process of the present invention, the background of which follows.

In most, if not all, types of integrated circuits and discrete devices, it has been usually necessary to make ohmic contacts to various regions. For example, in Schottky clamped-integrated circuits, and those employing Schottky barriers as active devices, whether integrated or in discrete form, it had been generally necessary not only to make ohmic contacts to several regions, but also to fabricate good Schottky barrier contacts. It is generally preferred to use the same metallization for both ohmic contacts and Schottky barriers in a particular device. Although one is not limited to this constraint, it is generally preferred from a production point of view.

In the prior art or conventional technology, when aluminum and/or its alloys with silicon and copper are used for metallization, a problem of nascent oxide (oxide which comes into being, or forms, or develops over bare silicon regions) is solved to some extent by heat treatments in a neutral ambient environment at temperatures between 450° C and 550° C. Under appropriate processing conditions, aluminum atoms can move through the nascent oxide layer and make intimate contact with the silicon regions, yielding good Schottky barriers and ohmic contacts. Metals other than aluminum can yield poor results.

If a metal-silicide, such as platinum-silicide, palladium-silicide or rhodium silicide, is used to form the Schottky barriers and ohmic contacts, the nascent oxide layer on the silicon substrate can cause problems. The platinum-silicide is usually preferred over the others because its barrier is the largest on N-type silicon and because of its superior reliability/performance characteristics. In such metallization schemes other metal layers like titanium-platinum-gold (beam lead technology) and titanium-tungsten-aluminum are deposited on these metal-silicide layers. These metal-silicide devices are more reliable than those devices using aluminum and its alloys only.

In prior art platinum-silicide processes, the nascent oxide on silicon regions is inevitably present during the processing of the silicon wafers. One prior art solution was to use chemical solution of hydrofluoric acid to etch away oxide on the silicon surface; however, as soon as the wafers are rinsed in water, an oxide layer is again immediately formed. Thickness of this nascent oxide layer is about 25 Angstroms, (one Angstrom = $10^{-10}$ meters) or greater, depending on processing conditions. This thickness is enough to prevent platinum from reacting with silicon to form a good, uniform layer of platinum silicide when the wafers are heat treated in a neutral ambient, even at 650° C. This is a problem of the prior art.

Another prior art or presently used process to remove nascent oxide from silicon regions where platinum-silicide ohmic contacts or Schottky barriers are to be formed, is to do in-situ sputter-etching of the silicon wafers prior to platinum deposition in the same sputtering system. Sputter-etching is basically an ionic bombardment of the surface to be cleaned off. After the usual ambient pressure pump-downs in the sputtering system, back-filling with an inert gas like dry argon to a pressure of about 20–40 microns, and applying radio frequency (or negative d.c.) high voltage to the electrode on which the silicon wafers are placed, an argon plasma is obtained. Depending on the voltage/wattage of the d.c./r.f. power, and its duration, a certain thickness of oxide, silicon and/or other substances present on the wafer surface are removed. Sputter-etching, in this case, is a bombardment of the surface of silicon with highly energized ions of argon, thus removing these impurities from the surface of the silicon. Reference to U.S. Pat. Nos. 3,737,743 and 3,855,612 will provide further information on sputter-etching, as it relates to Schottky barier devices.

The thickness of silicon oxide expected to be removed in this sputter-etching step is in excess of 100 Angstroms. Usually, more etching than that which is necessary is practiced in the processing to assure complete removal of the nascent oxide. This is done because an incomplete removal of the nascent oxide gives patchy or poor silicide formation, which in turn results in bad ohmic contacts and bad Schottky barriers.

However, there are problems also associated with this sputter-etching prior art process. If the sputter-etching is insufficient to remove all nascent oxide contaminants, there are problems with ohmic contacts and Schottky barriers since this imperfect process permits random variation such as increases in resistive values of the ohmic contacts. In turn, this permits other problems such as voltage and power loss at these increased-resistivity ohmic contacts with accompanying unpredictable device performance and reliability problems. Further, random variation such as decreases of resistivity of Schottky barrier potential heights permits higher leakage currents in Schottky devices as well as high-field edge-effects, with accompanying unpredictable device performance and again reliability problems. Finally, for this situation of insufficient sputter-etching, a problem of lifting of beam leads and contacts from the ohmic contact and Schottky barrier regions can occur.

But, suppose the sputter-etching were excessive, rather than inadequate. If excessive sputter-etching of the silicon wafers is done to ensure complete removal of nascent oxide layer, and to ensure good platinum silicide formation then other problems can occur as follows: First, excessive sputter-etching can remove an inordinate large amount of silicon oxide, in particular the phosphorus doped silicon oxide normally covering the emitter and various cross-under n-type regions. If this sputter-etching is not controlled properly, then the thin emitter glass (silicon) gives rise to low breakdown voltage and higher leakage and shorting problems. Next, if the oxide films have pinholes, excessive sputter-etching enlarges these pinholes, and can cause a short circuit.

Yet another problem which can occur during the prior art sputter-etching process is that if water vapor is present in the sputtering system, then an oxide layer can be created in this cycle due to reactive sputtering. Therefore, instead of removing the nascent oxide layer from silicon regions, an additional oxide layer is created! The water vapor in the system can come from inappropriate drying of the wafers prior to loading them into the sputter-etching system, and/or it can be obtained from other sources like argon gas, vacuum system and jigs used in the system. The mechanism of the formation of an oxide layer in this step is due to the reaction of the oxygen and/or hydroxide ion in the prior art ionized argon plasma with silicon. Therefore, instead of improving the silicon surface to give a good ohmic contact and a good Schottky barrier, the silicon surface is oxidized further, yielding bad results.

The present invention provides a solution to this multiplicity of problems of the prior art. The present invention employs and provides an improved process for manufacture of metal-semiconductor interfaces including but not limited to platinum-silicide interfaces, Schottky barrier potential junctions, and ohmic contacts, which improved process eliminates the sputter-etching step and thereby eliminates all of the above-detailed problems associated with the presently used and prior art sputter-etching technique. The present invention employs a novel plasma process to be described in detail hereinbelow.

SUMMARY OF THE INVENTION

The present invention relates to a process for fabricating a metal-semiconductor interface. This process employs the steps of producing an oxidized semiconductor wafer with photo-resisted areas, passivating the surface of the semiconductor wafer in a neutral, atomic nitrogen plasma, and depositing the metal on the semiconductor wafer to obtain the metal semiconductor interface.

Thus, in the semiconductor industry, where metal-semiconductor junctions or interfaces are manufactured for research or commercial purposes, it is clearly advantageous to employ the processes described and claimed herein, since they eliminate problems associated with the prior art sputter-etching technique.

It is thus an object of the present invention to provide an improved process for passivating the surface of a material.

It is a further object of the present invention to employ a gaseous plasma consisting of atomic, neutral nitrogen to passivate the surface of a material where the treated surface is then free from further oxide buildup.

It is an even further object of the present invention to provide an improved process for fabricating a metal-semiconductor interface, and particularly where the metal is platinum and the semiconductor is silicon.

Further objects and advantages of the present invention will be apparent after reference to the detailed description of the preferred emodiments and the appended drawings wherein:

DESCRIPTION OF THE PREFERRED EMBODIMENTS

Figure 1:
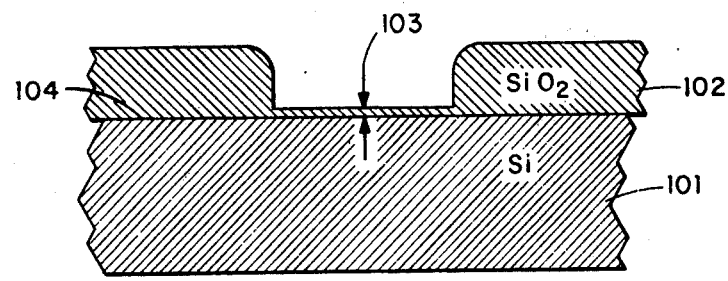
FIG. 1 is a cross sectional view of a semiconductor substrate with a nascent oxide layer.

Referring to FIG. 1, silicon substrate 101 interfaces with silicon dioxide layer 102 at boundary 104. Nascent oxide layer 103 is shown to be present on the silicon surface and can have a thickness of approximately 25 Angstroms. As noted earlier, nascent oxide on the silicon region forms immediately at room temperature and it is this layer which prevents the formation of good platinum silicide interfaces.

Figure 2:
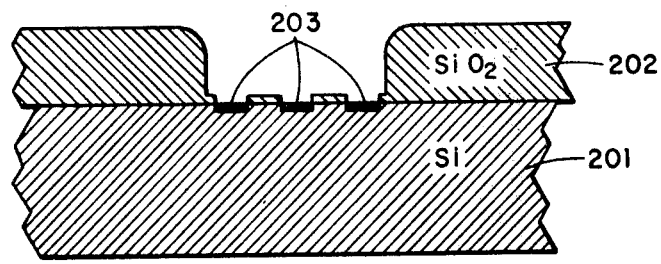
FIG. 2 is the cross sectional view of FIG. 1 showing incomplete removal of the nascent oxide layer.

FIG. 2 depicts essentially the same cross section as shown in FIG. 1 after treatment to remove nascent oxide. In this instance, incomplete removal of nascent oxide yields patchy platinum silicide as shown at junctions 203. Since all nascent oxide has not been removed, the resultant patchy platinum silicide results in a poor set of ohmic contacts and poor Schottky barriers. This is the result of inadequate sputter-etching. Thus, usually more sputter-etching than less is employed to ensure complete removal of the nascent oxide. However excess sputter-etching also gives poor results, as shown in FIG. 3.

Figure 3:
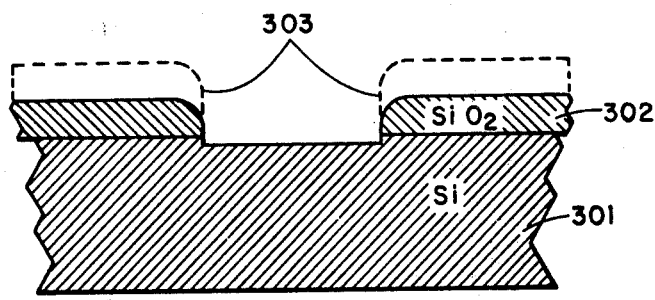
FIG. 3 is a cross sectional view of a semiconductor substrate showing results of excessive sputter-etching.

Referring to FIG. 3 substrate 301 essentially corresponds to substrates 201 and 101 of the earlier figures, and silicon dioxide layer 302 essentially corresponds to its counter part layers 202 and 102 in the other figures. However, dotted line 303 indicates the outline of what would have been the silicon dioxide layer, had it not been removed by excess etching under prior art conditions. It can be seen that a substantial amount of silicon dioxide has been removed because of excessive sputter etching, to ensure removal of the nascent oxide layer. However as noted, this permits other problems to develop such as low breakdown voltage high leakage and shorting problems.

Figure 6:
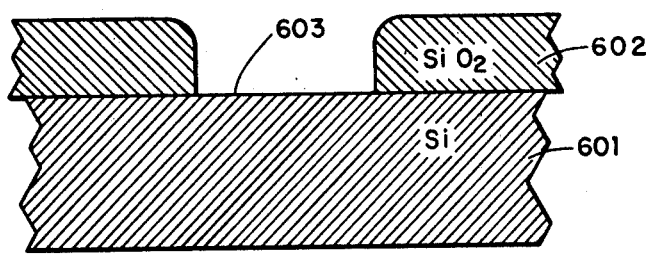

By contrast with the above described three figures, refer to FIG. 6 wherein it can be seen that silicon substrate 601 is in contact with silicon dioxide layer 602. The wafer had been subjected to the process of the present invention and thus shows the edge of a passivated surface 603, free from nascent oxide buildup and ready to accept a layer of platinum or other metal to form a Schottky barrier or an ohmic contact as described herein.

Figure 4:
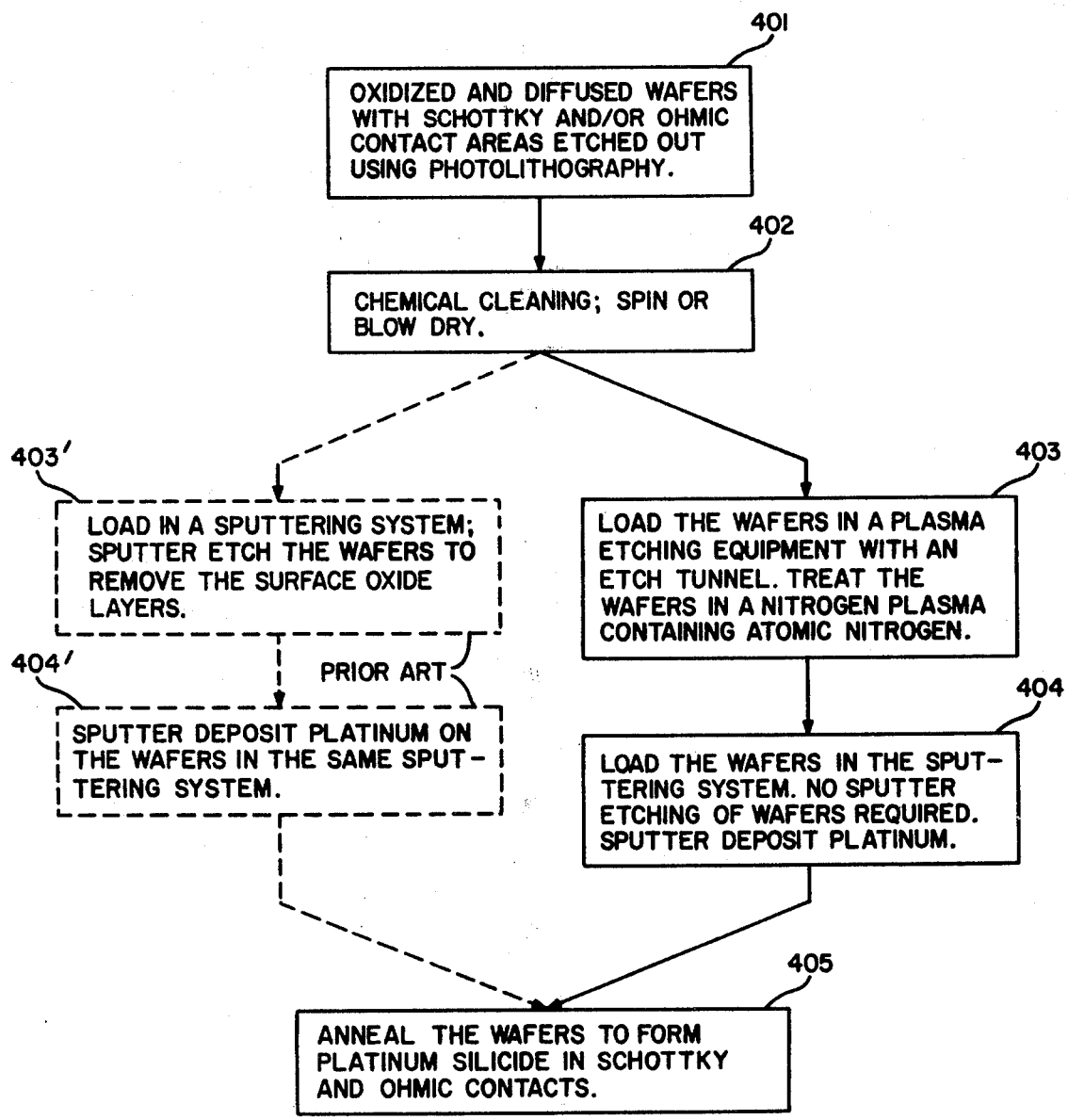
FIG. 4 is a schematic flow diagram incorporating the process of the present invention and comparing same with prior art.

Referring to FIG. 4, schematic diagram of process flows is depicted. Oxidizing and diffusing equipment 401 provides an oxidized wafer (not shown) of silicon with photo resisted areas. This wafer thus has etched out areas down to the base substrate (silicon). Cleaning and drying apparatus 402 operates upon the wafers from equipment 401. This equipment is standard in the industry and details thereof need not be presented herein for full comprehension of the present invention. Descriptions of equipments 401 and 402 and their operations can be found in such references as: G. E. Moore in "Microelectronics", E. Keonjian, ed., McGraw Hill Book Co., Inc., New York, (1963), p. 2.76.

In accordance with pinciples of the present invention, the oxidized wafer is then presented to and subjected to a nitrogen plasma as developed in plasma etching equipment 403. Plasma machine 403 is also commercially available, and its operation is described in incorporated-by-reference U.S. Pat. No. 3,879,597 entitled "Plasma Etching Device and Process". (A plasma can be made by subjecting a gas at low pressure to radio frequency voltage. The etching itself is accomplished by placing the gas at low pressure in a quartz cylinder surrounded by a source of radio frequency power, such as a coil or a number of electrodes, and then energizing the coil or electrode with high voltage at radio frequency. The production of a plasma is indicated by a bright glow within the quartz cylinder.)

After the proper length of time and temperature in plasma equipment 403, the surface of the wafer is passivated properly, whereafter it is subjected to platinum sputter-deposition (or other metalic deposition) in deposition equipment 404. Then the wafers subjected to other annealing equipment 405 for processing the wafer into what will become useful Schottky or ohmic contact devices. Annealing equipment 405 is standard and further information can be obtained in G. E. Moore (ibid).

More specifically, the present invention eliminates the sputter-etching step described earlier (and performed in 403') and eliminates sputter-deposition of platinum (in 404') consequently eliminating various problems discussed in connection with the prior art. The basic idea is to treat the silicon wafers in a nitrogen plasma consisting of atomic, neutral nitrogen; the basic discovery is that such treatment properly passivates the silicon surface and prevents nascent oxide thereon. Atomic, neutral nitrogen is intended to mean not the molecular $N_2$ nitrogen, and not to mean ionic $N+$ nitrogen but simply atomic nitrogen uncharged and unbonded to other nitrogen atoms.

The conditions under which such atomic nitrogen can be obtained for use in the process of the present invention are RF power equal 300 watts, pressure equals 1 torr, duration of wafer exposure equals 5 minutes. When platinum is thereafter deposited on silicon wafers in equipment 404 which have been treated in such nitrogen plasma, and subsequently heat treated in annealing apparatus 405 at 650° C, it has been observed that a good platinum silicide is formed on the silicon regions. The criterion of a good platinum silicide is that it should be opaque under infrared examination, and the barrier height of of the platinum silicide Schottky diode on n-type silicon should be $0.84 \pm 0.03$ eV, (electron volts). Both of these criteria were met on samples made according to the present invention.

Figure 5:
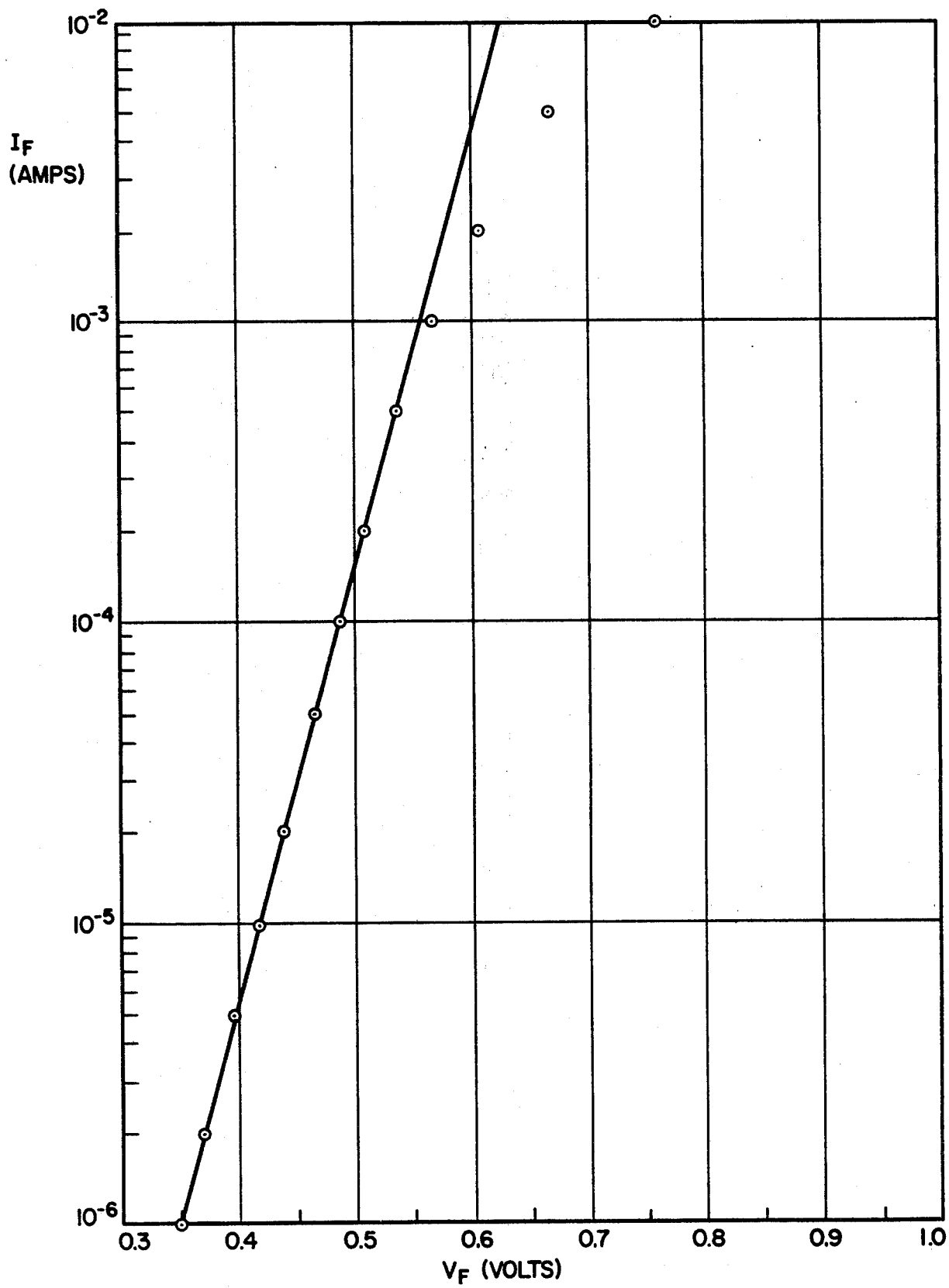
FIG. 5 is a graph showing performance characteristic results obtained from a device constructed in accordance with principles of the present invention; and, FIG. 6 is a cross sectional view of a semiconductor substrate showing no nascent oxide buildup, after treatment by the techniques of the present invention.

Referring finally to FIG. 5, a logarithmic plot of forward current vs. forward voltage as regards devices processed in accordance with principles of the present invention is shown, from which performance results can be calculated. The logarithmic plot is linear thus indicating the logarithmic (or exponential) physical nature of operation of the device. From the slope of the line which was obtained from measurements on the device prepared in accordance with principles of the present invention, and from other data such as geometrical size of the device, the Schottky barrier for a metal-semiconductor interface or junction has been calculated to be 0.82 eV. This falls within the proper barrier height range for a platinum-silicide Schottky diode, which should be $0.84 \pm 0.03$ eV.

A theoretical explanation or model to account for the improved devices flowing from this discovery and for this substantial advance in the art of semiconductor processing, is as follows. Atomic nitrogen, N, generated in a nitrogen plasma in an etch tunnel, and applied to a silicon wafer having nascent oxide on its surface, breaks the oxide. Such a plasma of atomic nitrogen is highly reactive and also breaks hydrated oxide molecules in addition to breaking the oxide, and they both are removed from the surface. The dangling bonds of silicon atoms on the surface latch onto nitrogen atoms providing a monolayer, or more of nitrogen coverage. This arrangement of nitrogen atoms on the silicon surface retards, or prevents, the interaction of oxygen and water vapor with silicon at room temperature. Thus the formation of a nascent oxide layer on the silicon surface is retarded and prevented.

Recapitulating, the present invention relates to treatment of silicon regions with a nitrogen plasma containing free radicals of nitrogen which react with the surface layer of the silicon oxide to remove the oxide from the silicon regions and thus passivate them so as to retard growth of the nascent oxide layer at room temperature. The silicon wafers so treated, and then be deposited with a metal like platinum without sputter etching; the platinum comes in intimate contact with the silicon surface. Heat treatment at some appropriate temperature causes the platinum to react with the silicon to form a monosilicide which gives good Schottky barriers on silicon regions having moderate resistivity and good ohmic contacts on those having low resistivity. (The basic difference between forming a Schottky barrier or an ohmic contact relates to the concentration of dopant in the substrate. The normal definition for the amount of concentration required to separate a Schottky barrier from an ohmic contact is: if the concentration of dopant in the substrate is $5 \times 10^{18}$ atoms per cubic centimeter or more than the contact is ohmic; if less the contact is Schottky.)

This invention can be embodied in other forms without departing from the spirit or essential characteristics thereof. For example, if nitrogen can be obtained in the uncharged, atomic state by means other than the specific plasma generating equipment disclosed and if that free nitrogen is used in the process described herein, that condition is intended to be included within the purview of the present invention.

Thus, the present embodiments are to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A process for fabricating metal-semiconductor interface comprising the steps of:
    a. producing an oxidized semiconductor wafer with photo-resisted areas;
    b. subjecting the surface of said semiconductor wafer to a neutral, atomic, nitrogen plasma to break nascent oxide from said surface and to passivate said surface to make said surface resistant to nascent oxide buildup; and
    c. depositing said metal on said semiconductur wafer to obtain said metal-semiconductor interface.

2. A process as recited in claim 1, wherein said semiconductor is silicon, comprising the additional step of:
    d. heat-treating said interface to cause metal-silicide formation thereat.

3. A process as recited in claim 2 and wherein said metal is selected from the group consisting of platinum, molybdenum, aluminum, titanium, rhodium, palladium, and tungsten.

4. A process as recited in claim 3, wherein said metal is platinum and the temperature of said heat-treating step is controlled to be about 650° C, said subjecting step further comprising the step of:
    e. subjecting said silicon wafer to said nitrogen plasma under R.F. power of about 300 watts, at pressure of about one torr, for a duration of about five minutes.

* * * * *